United States Patent
Yamaha et al.

[11] Patent Number: 5,998,814
[45] Date of Patent: Dec. 7, 1999

[54] SEMICONDUCTOR DEVICE AND FABRICATION METHOD THEREOF

[75] Inventors: Takahisa Yamaha; Seiji Hirade, both of Hamamatsu, Japan

[73] Assignee: Yamaha Corporation, Japan

[21] Appl. No.: 09/179,729

[22] Filed: Oct. 27, 1998

Related U.S. Application Data

[62] Division of application No. 09/047,832, Mar. 25, 1998.

[30] Foreign Application Priority Data

Mar. 27, 1997 [JP] Japan ..................................... 9-76167

[51] Int. Cl.$^6$ .............................. H01L 27/10; H01L 27/02
[52] U.S. Cl. .......................... 257/211; 257/758; 257/760; 257/762; 257/774
[58] Field of Search .................................. 257/758, 760, 257/762, 774, 211

[56] References Cited

U.S. PATENT DOCUMENTS

| | | | |
|---|---|---|---|
| 4,916,514 | 4/1990 | Nowak | 357/68 |
| 5,032,890 | 7/1991 | Ushiku et al. | 357/41 |
| 5,160,995 | 11/1992 | Wada et al. | 257/207 |
| 5,488,007 | 1/1996 | Kim et al. | 437/47 |
| 5,639,697 | 6/1997 | Weling et al. | 437/225 |
| 5,652,465 | 7/1997 | Hosoda et al. | 257/758 |
| 5,773,857 | 6/1998 | Ura | 257/211 |

FOREIGN PATENT DOCUMENTS

| | | |
|---|---|---|
| 63-211739 | 9/1988 | Japan . |
| 63-236319 | 10/1988 | Japan . |
| 1-239873 | 9/1989 | Japan . |
| 5-275531 | 10/1993 | Japan . |

*Primary Examiner*—Peter Toby Brown
*Assistant Examiner*—Hung Van Duong

[57] ABSTRACT

A method of fabricating a semiconductor device having a multi-layered wiring and including dummy wiring not contributing to connection of circuit elements, comprising the steps of: a) preliminarily preparing relationship between width of an isolated lower level wiring and thickness of an interlayer insulating layer with a planarized function formed on the isolated lower level wiring; b) preparing experimental results by forming dense wiring patterns in a first region on a semiconductor substrate, forming an interlayer insulating layer with a planarized function thereon, and measuring thickness of the interlayer insulating layer; c) determining a width of a dummy wiring to be disposed below an isolated upper level wiring, based on the relationship and the measuremental result; d) forming dense lower level wirings in a first region on another semiconductor substrate and a single lower level wiring having the desired width as a dummy wiring only at a location where an upper level wiring is to be formed in a second region on another semiconductor substrate, where an isolated wiring is to be formed as an upper level wiring; e) forming an interlayer insulating layer with a planarizing function to cover the lower level wirings; and f) forming an upper level wirings on the interlayer insulating layer in the first and second regions. A semiconductor device with a multi-layered wiring can be manufactured using a small quantity of data and has upper level wirings on the surfaces of a substantially same level.

4 Claims, 4 Drawing Sheets

SEMICONDUCTOR DEVICE AND FABRICATION METHOD THEREOF

This is a division of application Ser. No. 09/047,832, filed Mar. 25, 1998.

This application is based on Japanese patent application 9-76167 filed on Mar. 27, 1997, the entire contents of which are incorporated herein by reference.

BACKGROUND OF THE INVENTION

1. Field of the Invention

The present invention relates to a semiconductor device and a fabricating method thereof, and more particularly to a semiconductor device having a multi-layered wiring including a dummy wiring and a method for fabricating the same.

2. Description of the Related Art

In a semiconductor integrated circuit, with an increase of integration density the wirings become so complicated that formation of a multi-layered wiring is indispensable. An interlayer insulating layer is used to make insulation between a plurality of wiring layers. The interlayer insulating layer also makes insulation between different wiring patterns in a same wiring level.

A silicon oxide layer formed by a chemical vapor deposition (CVD) has an excellent dielectric property. However, it is a conformable or conformal layer having a surface morphology reflecting the surface shape of an underlying layer. When an interlayer insulating layer is formed only by a conformal insulating layer, steps on the surface become large with an increase of a number of the layers of a multi-layered wiring so that such problems as breaking and short-circuiting of the wirings occur.

In order to planarize a surface of the interlayer insulating layer, a method of using an insulating layer having a planarizing property such as a silicon oxide layer formed by spin-on-glass (SOG) or by a tetraethylorthosilicate(TEOS)-ozone is proposed. These insulating layers having a planarizing property eliminate the concaves and convexes on the surface of an underlying layer to a certain extent. However, some problems remain, which include a difficulty of planarizing a wide concave portion to the same extent as a narrow concave portion.

For the wide concave portion, is known a method of using a wiring pattern not contributing to circuit connection of a semiconductor integrated circuit, i.e. a dummy pattern, for eliminating the wide concave portion. For example, there are proposed a method of arranging once temporal wirings in all of the wiring channel regions of a gate array and then cutting off the temporal wirings according to a circuit connection to be realized (for example, refer to JP-A5-275531) and a method of forming dummy patterns in regions where upper level wirings will be formed, but no lower level wiring exists (for example, refer to JP-A 1-239873).

In order to form a dummy wiring pattern, preparation similar to that for forming a usual wiring pattern is necessary. For example, in order to form dummy wiring patterns in all of the vacant regions of a semiconductor chip, quantity of data required for wiring patterns is increased by a factor of 20 to 30. In order to handle such a vast quantity of data, data processing equipment should become large and a long time is required for processing.

SUMMARY OF THE INVENTION

It is an object of the present invention to provide a semiconductor device with a multi-layered wiring capable of being realized with a small quantity of data and of forming an upper level wiring on a substantially flat surface of an insulating layer.

Another object of the present invention is to provide a method of fabricating such a semiconductor device with a multi-layered wiring as above-mentioned.

According to one aspect of the present invention, there is provided a method of fabricating a semiconductor device having a wiring of multi-layered structure including a dummy wiring not contributing to connection configuration of circuit elements and comprising the steps of: a) preliminarily preparing a relation between a width of an isolated lower level wiring and thickness of an insulating layer with a planarized function formed on the isolated lower level wiring; b) preliminarily forming dense wiring patterns in a first region on a semiconductor substrate, forming thereon an interlayer insulating layer with a planarizing function, and measuring a resulting thickness of the interlayer insulating layer; c) determining a desired width of a dummy wiring to be disposed under an isolated upper level wiring from the relation between the width of the underlying wiring and the thickness of the insulating layer and the result of measurement of the thickness; d) forming dense lower level wirings in the first region on a semiconductor substrate and concurrently forming a lower level wiring with a desired width, in the second region where an isolated wiring will be formed as an upper level wiring, as a dummy wiring only at a place where the upper level wiring will be formed; e) forming the interlayer insulating layer with a planarizing-function to cover the lower level wiring; and f) forming upper layer wirings in the first and the second regions.

According to another aspect of the present invention, there is provided a semiconductor device comprising: a semiconductor substrate; an insulating layer including first and second regions surfaces of which are nearly on a same level; a dense wiring group including a number of wiring patterns with a first height and a first width formed on the first region; a single dummy wiring pattern formed in the second region, and having a same height as the first height and a width more than two times as large as the first width; an interlayer insulating layer formed to cover the dense wiring group and the dummy wiring pattern and having surfaces of substantially a same level over the first and the second regions; a first upper level wiring formed on the interlayer insulating layer in the first region and including a plurality of wiring patterns; and a second upper level wiring formed of a single wiring pattern on the interlayer insulating layer in the second region, having a width smaller than that of the dummy wiring pattern, and disposed along a center in a width direction of the dummy wiring pattern.

The interlayer insulating layer having a planarizing function has a property that it becomes thick in the dense wiring region, and thin in the isolated wiring region. Even if a dummy wiring with the same width as an isolated upper wiring pattern is disposed on the lower layer corresponding to the isolated wiring pattern, a level difference occurs between the surface of the interlayer insulating layer in the dense wiring region and that in the isolated wiring region. If the level difference of the interlayer insulating layer is near or above the depth of focus of an exposure equipment, accuracy of photolithography is degraded.

When the width of the lower level dummy wiring disposed below the isolated upper level wiring is increased, thickness of the interlayer insulating layer formed on the dummy wiring increases in correspondence to the width of the lower level dummy wiring. It becomes possible to adjust the level of the surface of the interlayer insulating layer under wiring patterns to be substantially of the same level, by preliminarily measuring a thickness of the interlayer insulating layer with a planarized function in the dense wiring region and selecting a width of the lower level dummy wiring pattern disposed below the upper isolated wiring in correspondence to this thickness.

As above mentioned, a semiconductor device having uniform levels of the surfaces of an interlayer insulating layer in a wiring formation regions can be provided, using only a limited data of dummy wiring.

DESCRIPTION OF THE PREFERRED EMBODIMENTS

The present inventors considered to dispose a lower level dummy wiring only under an upper level wiring in an isolated wiring region wherein the lower level wirings are not crowded, in order to decrease data for forming the dummy wiring.

Figure 5:
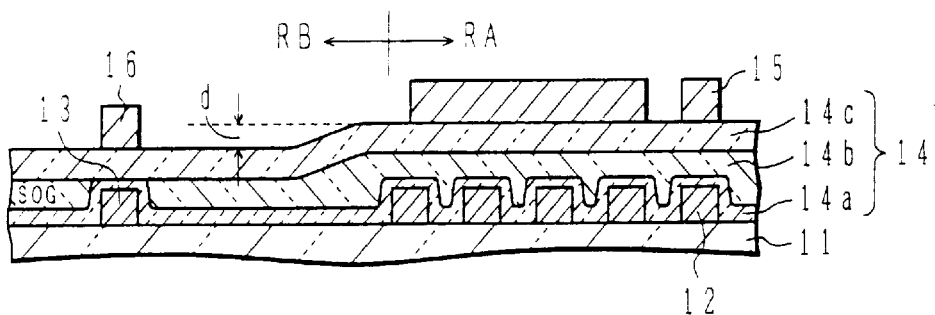
FIG. 5 is a cross sectional view illustrating the contents of a preliminary trial by the present inventors.

As shown in FIG. 5, lower level wirings 12 and 13 are formed on an underlying insulating layer 11 having a flat surface. The lower level wiring 12 has dense wiring patterns formed in a dense region RA where the wirings are formed dense. A lower level dummy wiring 13 is a dummy wiring pattern disposed only below an upper level wiring 16 in an isolated region RB where the wirings are not formed dense, and having the same width as the upper level wiring 16.

In the present specification, "dense region" denotes the region where the spaces on both sides of the wiring are less than 3 μm and "isolated region" denotes the region where those are larger than 3 μm.

An interlayer insulating layer 14 is formed of a lamination of silicon oxide layers 14a, 14b and 14c manufactured by CVD, SOG and CVD, respectively to cover the lower level wiring patterns 12 and 13. Silicon oxide layers 14a and 14c formed by CVD have uniform thickness in almost the entire region. The silicon oxide layer 14b absorbs the step in the underlying layer and forms a locally planarized flat surface. In the dense region RA, the silicon oxide layer 14b by SOG is formed with nearly uniform thickness over the lower level wiring patterns 12.

In the isolated region RB where the wiring patterns are not crowded, the silicon oxide layer 14b formed by SOG coated on the dummy pattern 13 is thin even if the lower level dummy wiring 13 is disposed, resulting in formation of a surface with a level different from the level of the surface of SOG silicon oxide layer in the dense region. A step d is produced between the surface of the interlayer insulating layer 14 in the dense region RA and that in the isolated region RB. Therefore, accuracy of the photolithography at the formation of the upper level wirings 15 and 16 is lowered.

It is unnecessary to provide the dummy wiring in the region where the upper level wiring is not formed. If the region where the dummy wiring is formed is restricted to only the region where the upper level wiring is formed, data for the formation of the dummy wiring can be decreased. However, if the dummy wiring pattern has the same pattern as that of the upper level wiring, the effect of the dummy wiring is remarkably decreased.

According to the results of the preliminary trial as abovementioned, the present inventors propose to adjust the width of a lower level dummy wiring.

Figure 1:
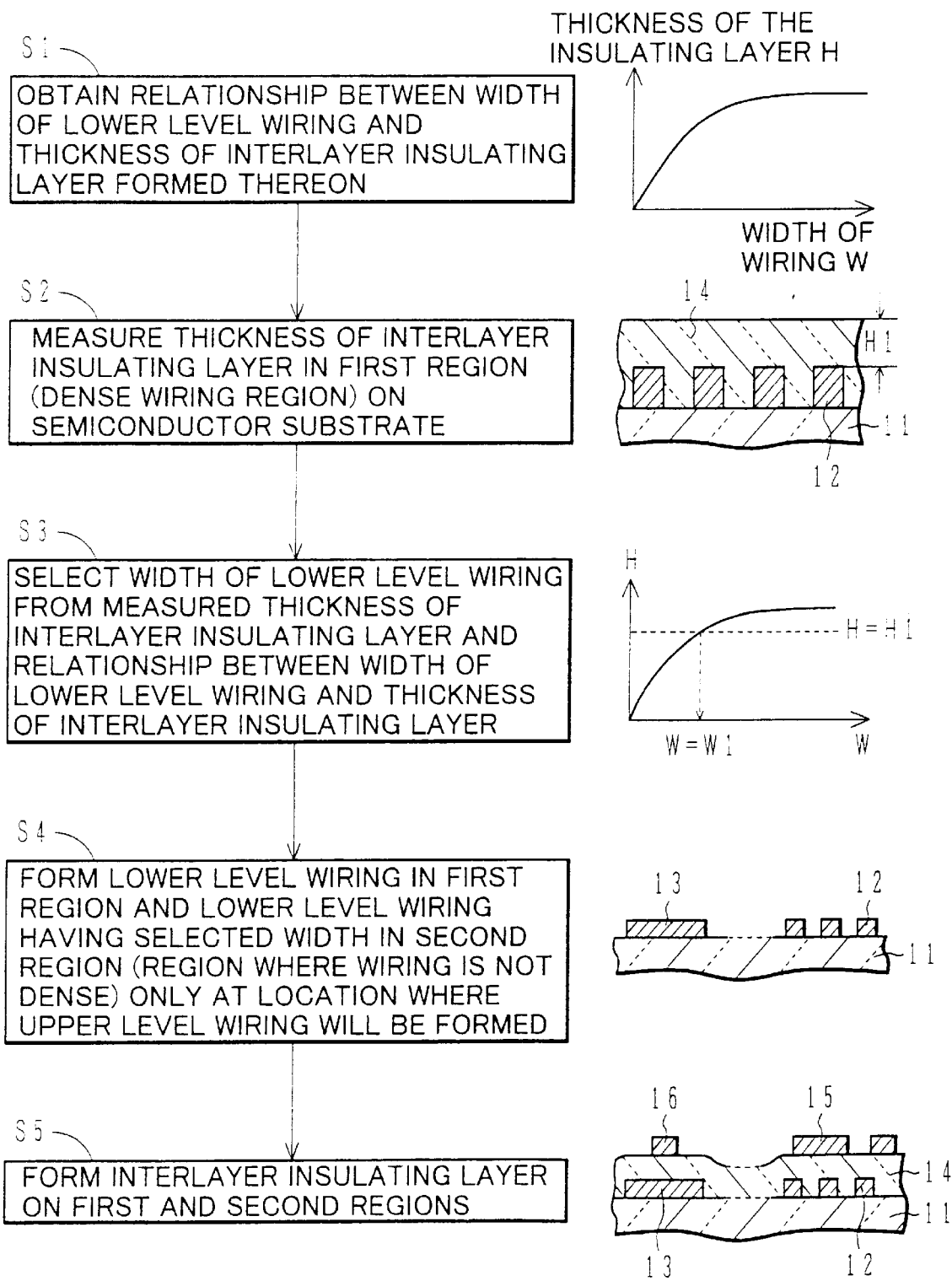
FIG. 1 is a flowchart for illustrating a method of manufacturing a semiconductor device according to an embodiment of the present invention, with graphs and cross sectional views for illustrating the contents of the steps.

FIG. 1 shows a flowchart illustrating an outline of a method of fabricating a semiconductor device according to an embodiment of the present invention, with graphs and cross sectional views illustrating the technical contents in each of the steps.

In step S1, a relation between the width of a lower level wiring and the thickness of an interlayer insulating layer with a planarizing function formed thereon is obtained. The thickness H of the interlayer insulating layer with a planarizing function has a tendency to increase with an increase of the width W of a lower level dummy wiring as shown in right side of the step S1.

On an isolated lower level wiring, an interlayer insulating layer with a thickness H corresponding to a width W of the lower level wiring can be obtained when the interlayer insulating layer with a planarizing function is formed under constant conditions.

Prior to actually fabricating a semiconductor device, such a relationship between W and H is preliminarily prepared. It is desirable to prepare a plurality of the relationships according to the conditions of manufacturing the interlayer insulating layer.

Figure 2:
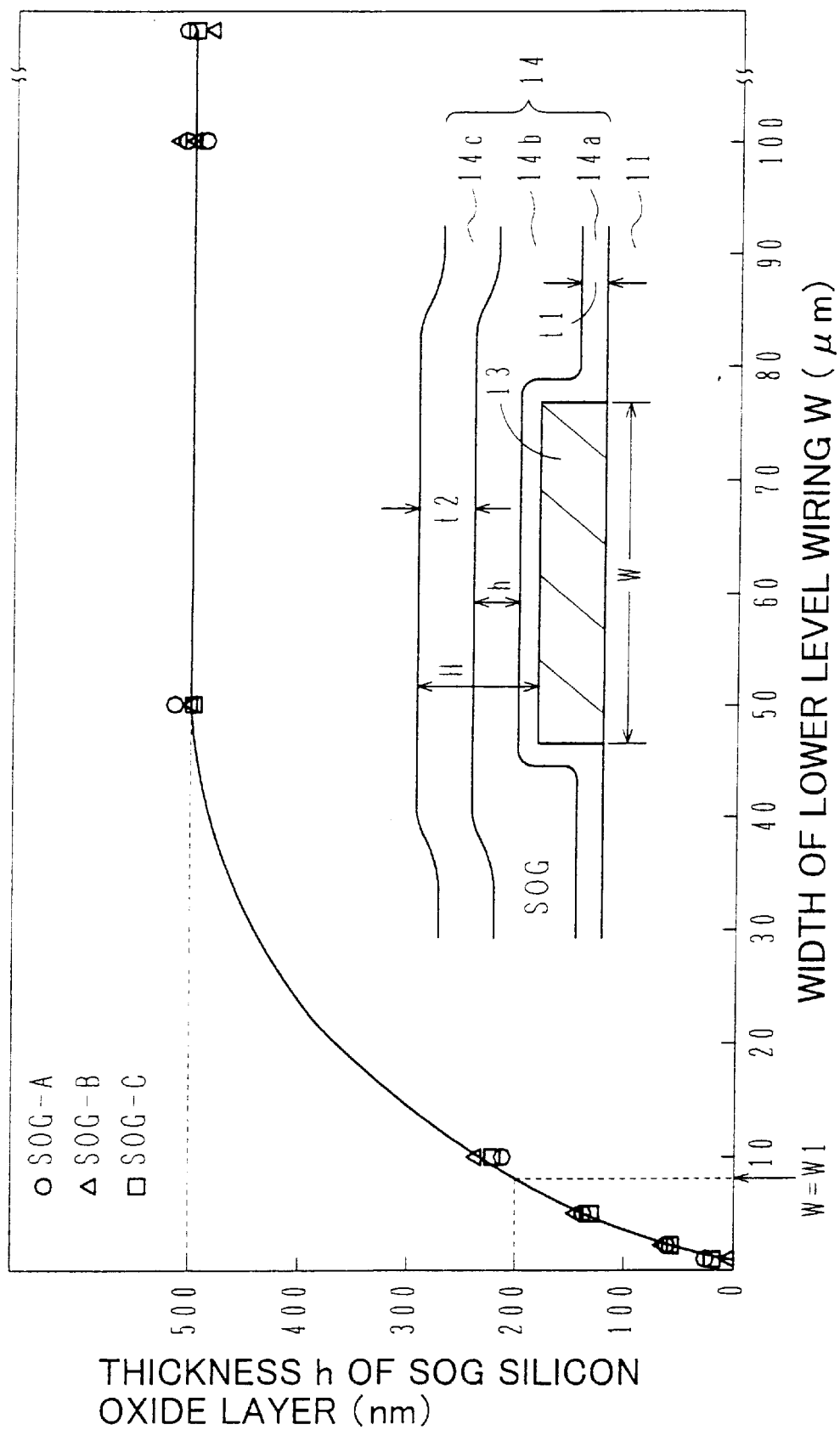
FIG. 2 is a graph showing a relation between width of a lower level wiring and thickness of a silicon oxide layer formed thereon by SOG in an embodiment of the present invention.

FIG. 2 shows one concrete example of the step S1. As shown in the illustration in the graph, an isolated lower level wiring pattern 13 with width W is formed on the surface of a lower level insulating layer 11 and an interlayer insulating layer 14 is formed thereon. The interlayer insulating layer 14 has a laminated structure made of a first silicon oxide layer 14a formed by CVD, a silicon oxide layer 14b formed by SOG and a second silicon oxide layer 14c formed by CVD.

The silicon oxide layers 14a and 14c formed by CVD are formed nearly conformal to the surface of an underlying layer and have respective thickness of t1 and t2 which are nearly constant independent of the shape of the underlying layer. The silicon oxide layer 14b formed by SOG has a thickness h depending on the shape of the underlying layer. When the conditions of forming the interlayer insulating layer are kept constant, only h varies according to the conditions of the underlying layer, while t1 and t2 take constant values.

The thickness of the silicon oxide layer 14b formed by SOG at nearly the center portion of the wiring pattern 13 is measured as h. While the width W of the wiring pattern 13, is varies in various ways, it is measured how the thickness h of the silicon oxide layer 14b made by SOG changes, to preliminarily prepare the relationship between W and h.

Since the respective thicknesses t1 and t2 of the silicon oxide layers 14a and 14b formed by CVD are nearly constant, a change in the thickness h of the silicon oxide layer 14b formed by SOG is nearly equal to the change in the thickness H of the interlayer insulating layer 14, i.e. H−h=t 1+t 2= constant.

In the experiment performed by the present inventors, three kinds of materials were used as SOG. The general characteristics show nearly the same tendency for these three kinds of materials. With an increase of the width W of the wiring layer 13, the thickness h of the silicon oxide layer formed by SOG almost linearly increases initially, and then lowers the rate of increase, and tends to be saturatied. In the graph shown in FIG. 2, for the wiring width larger than 50 $\mu$m the thickness h of the silicon oxide layer deposited by SOG on the wiring is nearly constant. For the sample used in this graph, conditions of forming the silicon oxide layer by SOG are so selected that the thickness of the silicon oxide layer formed by SOG is about 500 nm on the flat (entire) electrode layer.

In recent years, most of the wiring patterns are at most 2~3 $\mu$m wide and submicron wirings are not uncommon. Taking such a situation into consideration, it can be said that the width of the dummy wiring in the isolated region is more than two times as large as the typical wiring width in the dense region.

Returning to FIG. 1, following the step S1, a process of the step S2 is performed. The interlayer insulating layer is formed under constant conditions in the first region which is the dense wiring region on the semiconductor substrate. Then the thickness of the interlayer insulating layer is measured. The wirings in the dense region have for example, a minimum wiring width and include a number of wiring patterns distributed with separation equivalent to the minimum wiring width. If necessary, a dummy wiring pattern is formed in the space between the wirings. It is desired that the wirings in this dense region have the same pattern as the wirings in the dense region of the semiconductor device to be fabricated in practice.

A cross section shown on the right hand side of the step S2 schematically shows the structure formed in this step on the semiconductor substrate. The dense wiring patterns 12 are formed on the underlying insulating layer 11. The interlayer insulating layer 14 is formed thereon. The height H1 of the surface of the interlayer insulating layer 14 above the surface of the wiring pattern 12 is measured. In the case of formation of the interlayer insulating layer with a lamination structure as shown in FIG. 2, the measurement may also be made on the thickness of the layer which varies with the shape of the underlying layer for example, the thickness h of the silicon oxide layer formed by SOG.

Figure 3A:
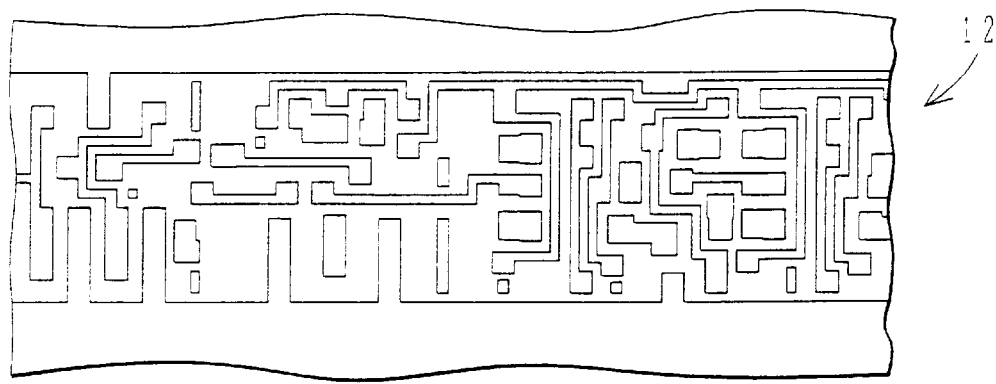
FIGS. 3A to 3C are top views and a cross sectional view for illustrating contents of an embodiment of the present invention.

FIG. 3A shows an example of the wiring pattern in the dense region. In the dense region, dummy wiring patterns are so arranged that gaps larger than a selected value are not produced.

Figure 3B:
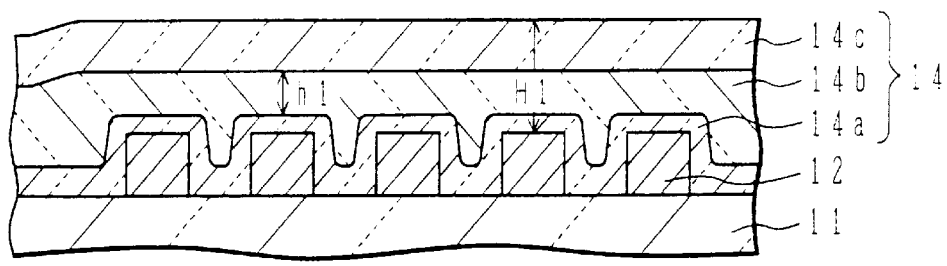

FIG. 3B schematically shows the structure of the interlayer insulating layer in the dense region. The dense lower level wirings 12 are formed on the surface of the underlying insulating layer 11 and thereon the interlayer insulating layer 14 is formed. The interlayer insulating layer 14 has a structure sandwiching the silicon oxide layer 14b formed by SOG between the silicon oxide layers 14a and 14c formed by CVD.

The thickness H1 of the interlayer insulating layer 14 formed on the surface of the lower level wiring 12 has a constant relation with the thickness h1 of the silicon oxide layer 14b formed by SOG such as H1−h1= constant. Hence, either the overall thickness H1 of the interlayer insulating layer or the thickness h1 of the silicon oxide layer formed by SOG can be used as a parameter.

In the step S3, width of the lower level dummy wiring in the isolated region is determined based on the relationship obtained in the step S1 so that the thickness of the interlayer insulating layer obtained in the step S2 coincides with the thickness of the interlayer insulating layer in the isolated region. Namely, width W of the dummy wiring in the isolated region is determined as shown in the graph on the right hand side of the figure so that the thickness of the interlayer insulating layer H1 obtained in the step S2 coincides with the thickness in the isolated region. When the interlayer insulating layer has a structure sandwiching the silicon oxide layer formed by SOG between the silicon oxide layers formed by CVD as shown in FIG. 2, width of the dummy wiring may be so chosen that the thickness h of the silicon oxide layer formed on the dummy wiring by SOG in the dense region is nearly equal to that in the isolated region. For example, in the relation shown in FIG. 2, width of the dummy wiring in the isolated region is selected to be about 8~9 $\mu$m when thickness of the silicon oxide layer formed by SOG in the dense region is 200 $\mu$m.

Underlying surfaces of the wirings are not necessary to be strictly on the same level. It is sufficient if a satisfactory accuracy of photolithography is provided.

If the condition described in the step S3 is selected, surface level of the interlayer insulating layer can be adjusted to be nearly uniform, by arranging only one dummy wiring below the upper level wiring in the isolated region.

Figure 3C:
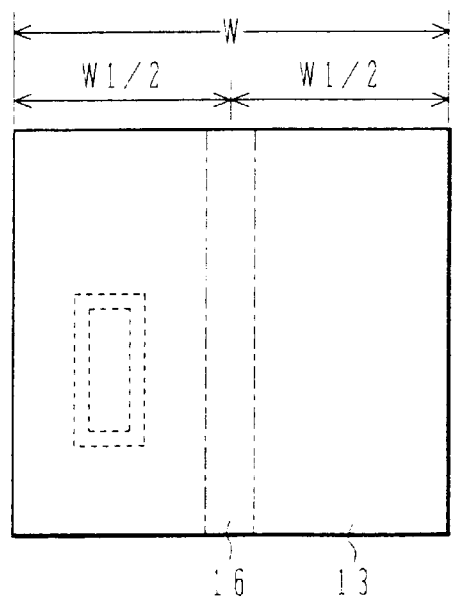

FIG. 3C schematically shows the relation between the upper level wiring in the isolated region and the lower level dummy wiring disposed therebelow. It is assumed that width of the lower level dummy wiring is required to be W1 in order to form silicon oxide layer with desired thickness under the upper level wiring 16. The upper level wiring 16 and the lower level dummy wiring 13, which are in the above-described relation, are disposed in a configuration as shown in FIG. 3C, wherein the upper level wiring 16 is disposed along the center line with respect to the width of the lower level dummy wiring 13.

When another pattern is located in the region of the lower level dummy wiring 13, it is preferable to form the lower level dummy wiring leaving a gap of a certain width (for example, a gap of an allowed minimum width) around another pattern as shown in the figure by broken lines.

In the step S4, the lower level wiring is formed in the first region, i.e., the dense wiring region and the lower dummy wiring patterns having the width determined in the step S3 are concurrently formed in the second region, i.e., the isolated region wherein the wirings are not dense. Here, the dummy wiring is formed only below the place at which the upper level wiring is formed. Hence, data for the formation of the dummy wiring can be remarkably decreased.

In the step S5, the interlayer insulating layer 14 is formed on the surface including the first and the second regions and the upper level wirings 15 and 16 are formed thereon.

Figure 4:
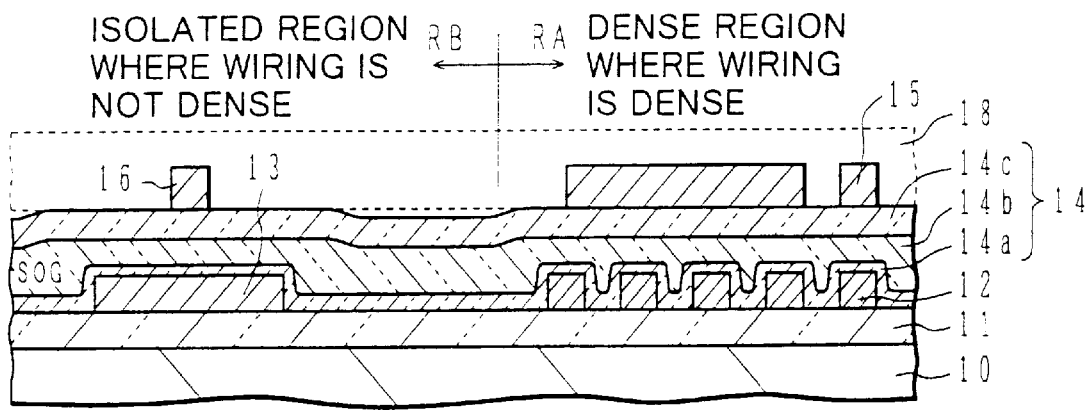
FIG. 4 is a cross sectional view illustrating an example of the structure of a semiconductor device obtained by the fabrication method shown in FIG. 1.

FIG. 4 schematically shows the structure of the semiconductor device having the wiring structure obtainable by the processes shown in FIG. 1. In the figure, the right hand side is the dense region RA where the wirings are dense and the left hand side is the isolated region RB where the wirings are not dense. In the dense region RA, dense lower level and dummy wirings 12 are formed on an underlying insulating layer 11 and an interlayer insulating layer 14 is formed on the wirings 12. The interlayer insulating layer 14 has a lamination structure in which a silicon oxide layer 14b formed by SOG is sandwiched between silicon oxide layers 14a and 14c formed by CVD. In the dense region, the silicon oxide layer 14b formed by SOG exhibits a nearly constant thickness corresponding to the wiring width and density.

In the isolated region, a lower level dummy wiring 13 the width of which is so selected as above-mentioned is formed on the underlying insulating layer 11 and the interlayer insulating layer 14 is formed over the wiring 13. The width of the lower level dummy wiring 13 is so selected that the thickness of the silicon oxide layer 14b formed by SOG above the dummy wiring 13 has nearly the same thickness as the silicon oxide layer 14b formed by SOG in the dense region. Hence, the interlayer insulating layer 14 above the central portion of the lower level dummy wiring 13 (with respect to the width direction) in the isolated region has nearly the same level as the interlayer insulating layer in the dense region.

The upper level wirings 15 and 16 are formed on the surface of the interlayer insulating layer 14. Since the upper level wirings 15 and 16 are formed on nearly the same level, high accuracy of the photolithography is ensured.

An insulating layer 18 is further formed to cover the upper level wirings 15 and 16. If necessary, the insulating layer 18 is formed as an interlayer insulating layer to form a multi-layered wiring. For example, when the isolated wiring is located only on the third layer of a triple-layered wiring, the dummy wirings may be formed on the first and the second levels so that the underlying surface of the third wiring has nearly an uniform level.

Figure 6:
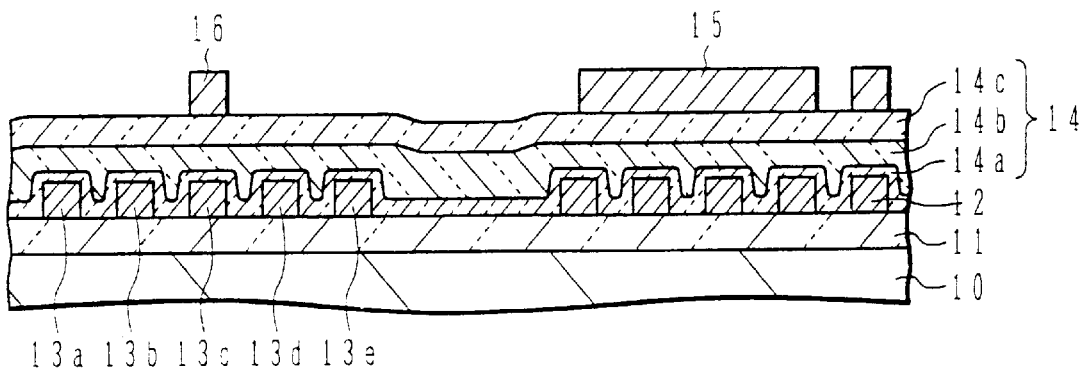
FIG. 6 is a schematic cross sectional view for illustrating a method of fabricating a semiconductor device according to another embodiment of the present invention.

FIG. 6 schematically shows the structure of the semiconductor device according to another embodiment of the present invention. In this embodiment, the lower level dummy wiring 13 in the isolated region is formed by a plurality of wiring patterns 13a, 13b, . . . Since the the dummy wiring patterns 13a, 13b, . . . are not used for connecting circuit elements, their size and distribution can be selected freely.

For example, a lattice-form dummy wiring pattern is formed under the region, where an isolated wiring will be formed on the upper layer. Width of the silicon oxide layer deposited by SOG on the dummy wiring can be varied by varying the space and number of the lattices. The dummy wiring may be realized not only in the lattice-form but also in various other forms such as a loop or loops. In those cases, data for the dummy wiring can also be decreased by limiting the region, where the dummy wiring is formed. In this embodiment, the width of the dummy wiring pattern is the distance from one end to the other end of the outermost dummy wiring. This distance is equivalent to the width of the dummy wiring in the first embodiment.

The present invention has been described in connection with the preferred embodiments. The invention is not limited only to the above embodiments. It will be apparent to those skilled in the art that various modifications, improvements, combinations and the like can be made by those skilled in the art. For example, the interlayer insulating layer is only required to have a planarizing function, and is not limited to a triple-layered structure.

What are claimed are:

1. A semiconductor device comprising:
    a) a semiconductor substrate;
    b) an insulating layer formed on said semiconductor substrate and including a first and a second region having surfaces of substantially a same level;
    c) a dense wiring group including a number of wiring patterns with a first height and a first width, formed on said first region;
    d) a single dummy wiring pattern having a same height as said first height and a larger width than said first width, formed on said second region;
    e) an interlayer insulating layer having a surface of substantially uniform level in said first and second regions, covering said dense wiring group and dummy wiring pattern;
    f) a first upper level wiring pattern including a plurality of wiring patterns formed on the interlayer insulating layer in said first region; and
    g) a single second upper level wiring pattern formed on the interlayer insulating layer in said second region, having a smaller width than said dummy wiring pattern and disposed substantially along a center, in a direction of width, of the dummy wiring.

2. A semiconductor device according to claim 1, wherein said interlayer insulating layer has a level of the surface lower than said substantially uniform level in a region between said first and second regions.

3. A semiconductor device according to claim 1, wherein said interlayer insulating layer includes a region formed by SOG.

4. A semiconductor device comprising:
    a) a semiconductor substrate;
    b) an insulating layer formed on said semiconductor substrate and including first and second regions having surfaces of nearly a same level;
    c) a dense wiring group formed on said first region and including a number of wiring patterns with a first height and a first width;
    d) a dummy wiring pattern group formed on said second region and having a same height as said first height and having a width as a whole larger than said first width;
    e) an interlayer insulating layer having surfaces of substantially uniform level over said first and second regions, covering said dense wiring and dummy wiring pattern groups;
    f) first upper level wiring patterns formed on the interlayer insulating layer in said first region; and
    g) a single second upper level wiring pattern formed on the interlayer insulating layer in said second region, having a smaller width than said width as a whole of said dummy wiring pattern group, and disposed along substantially a center, in width direction, of the dummy wiring pattern group.

* * * * *